United States Patent
Igarashi (10) Patent No.: US 7,666,700 B2
(45) Date of Patent: Feb. 23, 2010

(54) METHOD FOR FABRICATION MEMS-RESONATOR

(75) Inventor: Yasushi Igarashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 154 days.

(21) Appl. No.: 12/044,060

(22) Filed: Mar. 7, 2008

(65) Prior Publication Data

US 2008/0233673 A1 Sep. 25, 2008

(30) Foreign Application Priority Data

Mar. 23, 2007 (JP) .............................. 2007-077538

(51) Int. Cl.
*H01L 21/00* (2006.01)
(52) U.S. Cl. .............................. 438/50; 438/51; 438/52; 438/53; 257/E29.325
(58) Field of Classification Search .................... 438/26, 438/50–53
See application file for complete search history.

(56) References Cited

U.S. PATENT DOCUMENTS

| | | | | |
|---|---|---|---|---|
| 6,808,954 B2 * | 10/2004 | Ma et al. | ........................ | 438/51 |
| 6,938,334 B2 * | 9/2005 | Yu | ............................... | 29/830 |
| 7,102,467 B2 * | 9/2006 | Lutz et al. | .................... | 333/186 |
| 7,115,436 B2 * | 10/2006 | Lutz et al. | ..................... | 438/48 |
| 7,406,761 B2 * | 8/2008 | Jafri et al. | ...................... | 29/831 |
| 7,410,828 B2 * | 8/2008 | Quenzer et al. | ............. | 438/106 |
| 7,465,593 B2 * | 12/2008 | Yamazaki et al. | ............. | 438/26 |
| 7,517,711 B2 * | 4/2009 | Naniwada | ..................... | 438/50 |
| 2009/0108381 A1 * | 4/2009 | Buchwalter et al. | ......... | 257/415 |

FOREIGN PATENT DOCUMENTS

JP 2006005731 1/2006

OTHER PUBLICATIONS

Bannon, Frank D, III, Clark, John R., Nguyen, Clark T.C., High-Q HF Microelectromechanical Filters, IEEE Journal of Solid-State Circuits, Apr. 2000, pp. 512-526, vol. 35, No. 4.

* cited by examiner

*Primary Examiner*—David A Zarneke
(74) *Attorney, Agent, or Firm*—Volentine & Whitt, P.L.L.C.

(57) ABSTRACT

The present invention is an etching mask used for fabricating of the MEMS resonator including an oscillator which both edges are fixed to a base substance and vibrates to a vibrating direction, and an electrode which is fixed to a base substance by vibration is impossible in parallel for the oscillator, and is placed every one or more at the both sides of the oscillator. The etching mask includes a mask pattern 36 for oscillators which covers an oscillator formation scheduled region 34 on a conductive film 30 formed all over a sacrificial film which covers a region of the principal surface except both edges of the oscillator, and a mask pattern 40 for electrodes which covers an electrode formation scheduled region 38 on a conductive film. The width about a vibrating direction of a mask pattern for oscillators and a mask pattern for electrodes is made the same, and a gap between a mask pattern for oscillators and a mask pattern for electrodes and a gap between adjoining mask patterns for electrodes are made the same.

2 Claims, 9 Drawing Sheets

METHOD FOR FABRICATION MEMS-RESONATOR

CROSS REFERENCE TO RELATED APPLICATION

This application claims the priority of Application No. 2007-077538, filed Mar. 23, 2007 in Japan, the subject matter of which is incorporated herein by reference.

TECHNICAL FIELD OF THE INVENTION

This invention relates to a resonator, and in particular, relates to a method for fabricating a MEMS (micro Electro Mechanical Systems) resonator, and an MEMS resonator itself.

BACKGROUND OF THE INVENTION

A MEMS resonator provided with a beam-shaped vibration portion where both edges are fixed, and an electrode provided near this vibration portion is known (for example, refer to patent document 1 and non-patent document 1). The resonator described in patent documents 1 and non-patent document 1 (it is also hereafter referred to "conventional type resonator") vibrates the vibration portion using the change of electrostatic capacity of the vibration portion which occurs by impressing alternating voltage to the electrode.

It is known that resonance frequency "f0" of the vibration portion is given by the following (1) formulas:

$$f0 = (1/2\pi)\{(km - ke)/mr\}0.5 \tag{1}$$

where "km" is a spring constant of the vibration portion, "ke" is a spring constant of the vibration portion in the state where bias voltage is impressed, and "mr" is the effective mass of the vibration portion.

As cleared by equation (1), resonance frequency f0 depends on "km", "ke", and "mr". Incidentally, "km", "ke", and "mr" are greatly influenced by the size (length, width, and thickness) of the vibration portion.

Therefore, when fabricating two or more resonators equal to resonance frequency "f0", it is necessary to form a vibration portion with sufficient accuracy of dimension.

[Patent Document 1] Japanese Patent Publication JP2006-5731A

[Non-patent document 1] Frank D. Bannon, III, et al, "High-QHF Microelectromechanical Filters", IEEE Journal of solid-state circuits, Vol. 35, No. 4, April, 2000, pp 512-526

However, in fabricating of the above-mentioned conventional type resonator, there was a problem that a dimension error is easy to be introduced into the vibration portion by a formation process of the vibration portion. Hereafter, this problem will be explained in detail.

Generally, the vibration portion is formed of dry etching. Incidentally, when patterning by dry etching, it is known that the so-called "micro loading effect" from which an etching rate changes according to roughness and fineness of a formed photoresist pattern occurs. That is, an etching rate becomes relatively slower in an area with high pattern density, and conversely, an etching rate becomes relatively faster in an area with low pattern density.

This micro loading effect causes an uncontrollable error to occur depending on pattern density near the vibration portion in a size of the vibration portion. As a result, resonance frequency f0 of a resonator will shift from a designed value.

OBJECTS OF THE INVENTION

This invention is achieved in view of a problem mentioned above. Therefore, a first object of the present invention is to make uniform variation in an etching rate, by a micro loading effect as much as possible, and to provide a MEMS resonator in which a vibration portion can be fabricated excellent in size control nature.

A second object of the present invention is to provide a method for fabricating a MEMS resonator for forming a vibration portion excellent in size control nature, that is, there is little variation in oscillating frequency.

Moreover, a third object of the present invention is to provide an etching mask of specific shape used by the method for fabricating the MEMS resonator mentioned above.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

The present invention is related with fabricating of a MEMS resonator including an oscillator and an electrode. The oscillator includes a vibration portion which vibrates in a vibrating direction on a principal surface of a base substance and a fixed portion connected to the end of the vibration portion and fixed to the base substance, and the electrode is provided on both sides of the oscillator.

And the following process steps (a) to (e) are provided:
(a) forming a sacrificial film for covering said principal surface excluding a region to be used for said fixed part;
(b) forming a conductive film all over said principal surface upside so as to cover said sacrificial film;
(c) forming a mask pattern for oscillators which covers a region to be used for an oscillator, on said conductive film, and forming a mask pattern for electrodes which covers a region to be used for an electrode, on said conductive film, so that those patterns are apart from each other;
(d) performing dry etching for said conductive film, using said mask pattern for oscillators and said mask pattern for electrodes as an etching mask, and forming said oscillator and said electrode; and
(e) removing said sacrificial film.

Here, the mask pattern for oscillators includes a mask pattern part for a vibration portion extended linearly with a uniform width, and a mask pattern part for a fixed part joined with the end of the mask pattern part for a vibration portion.

Moreover, the mask pattern for electrodes includes a mask pattern part for first electrode terminal groups and a mask pattern part for second electrode terminal groups which are provided in mirror image relationship on both sides of said mask pattern for oscillators.

Furthermore, each of said mask pattern part for the first electrode terminal groups and said mask pattern part for the second electrode terminal groups includes two or more elongated mask pattern parts used for the electrode terminal, each of the elongated mask patterns extending linearly with a uniform width and with a space between adjacent patterns.

Here, the width of said mask pattern part for vibration portions and the width of the said elongated mask pattern part are substantially the same as each other. The gap or space between said mask pattern part for vibration portion and said elongated mask pattern part located adjacent the mask pattern part for vibration portion is determined to be the same as a gap or space between adjacent elongated mask pattern parts.

According to the present invention, the mask pattern part of every at least one or more elongated is placed on both sides of the mask pattern part for vibration portions. And the width about the vibrating direction of the mask pattern part for vibration portions and the elongated mask pattern part is made equal. Furthermore, the gap between the mask pattern part for vibration portions and the elongated mask pattern part, and the gap between the elongated mask pattern parts of contiguous are made equal. That is, in the present invention, the mask pattern for oscillators and the mask pattern for electrodes are placed so that the pattern density of the mask pattern in the region to be used for the MEMS resonator becomes uniform or substantially uniform.

As a result, in the process step of the dry etching for forming the oscillator, variation in the etching rate by a micro loading effect can be made uniform as much as possible. Therefore, the size control nature of the oscillator obtained after sacrificial film clearance improves. As a result, the variation in the resonance frequency of the MEMS resonator can be controlled to practically sufficient grade.

In addition, the pattern density expresses the existence region of a pattern and the distribution state of a nonexistence region of a pattern in the region which is a region in which the resist pattern is formed and is put to etching gas. Therefore, "pattern density is uniform" means that the existence region of a pattern and the nonexistence region of a pattern are existed uniformly and are distributed in the region put to etching gas.

For example, preferably, "pattern density" can be expressed with the ratio of the sum total of the length of the outer circumference of an etched region for the area of the partition, when this partition put to the etching gas which includes the region by which dry etching is performed actually (hereinafter it is called "etched region") on the surface of a conductive film is considered. Here, in measuring pattern density for every partition, it sets up a congruous partition. In this case, "pattern density is uniform or substantially uniform" means that all the ratios obtained for every partition are same or substantially the same.

An etching mask related to the second aspect of the present invention is used for fabricating of the MEMS resonator mentioned above. This etching mask is formed on the cascade screen which has a sacrificial film which covers the principal surface except the region to be used for the fixed part, and the conductive film formed all over the principal surface upside so that the sacrificial film is covered.

The etching mask includes a mask pattern for oscillators which covers the oscillator formation scheduled region on a conductive film, and a mask pattern for electrodes which covers the electrode formation scheduled region on a conductive film.

Here, the mask pattern for oscillators includes a mask pattern part for vibration portions extended linearly in definite width, and a mask pattern part for fixed parts joined with the end.

Moreover, the mask pattern for electrodes includes a mask pattern part for the first electrode terminal groups and a mask pattern part for the second electrode terminal groups which are provided in mirror image relationship on both sides of the mask pattern for oscillators.

Furthermore, each of the mask pattern part for the first electrode terminal groups and the mask pattern part for the second electrode terminal groups includes two or more elongated mask pattern parts for electrode terminal formation which extended linearly in definite width, and is mutually estranged and provided at the fixed gap.

Here, width of the mask pattern part for vibration portions and width of the elongated mask pattern part are substantially made the same. Moreover, the gap between the elongated mask pattern parts which adjoins the mask pattern part for vibration portions and the mask pattern part for vibration portions, and the gap between the elongated mask pattern parts which is mutually contiguous are substantially made the same.

That is, according to the etching mask of the present invention, the pattern density of the etching region in the region to be used for the MEMS resonator is made uniform or substantially uniform. As a result, in the dry etching performed at the time of formation of an oscillator, variation in the etching rate by a micro loading effect can be made uniform as much as possible by using the etching mask of the present invention. Thereby, the size control nature of the oscillator obtained after sacrificial film clearance improves. As a result, the MEMS resonator with which the variation in resonance frequency is reduced is obtained.

A MEMS resonator related to the third aspect of the present invention includes an oscillator and an electrode. The oscillator includes a vibration portion which vibrates to a vibrating direction on a principal surface of a base substance, and a fixed part connected to the end of the vibration portion and fixed to the base substance. The electrode includes a first electrode terminal group and a second electrode terminal group provided in mirror image relationship on both sides of the oscillator, and excites the oscillator.

Here, each of the first electrode terminal group and the second electrode terminal group includes two or more electrode terminals which extended linearly in definite width and is mutually estranged and provided at the fixed gap.

Moreover, width of the vibration portion and width of the electrode terminal are substantially made the same. Furthermore, the gap between the electrode terminals which adjoin the vibration portion and the vibration portion, and the gap between the electrode terminals which are mutually contiguous are substantially made the same. Moreover, one electrode terminal which adjoins the vibration portion included in one of electrode terminal groups among the first and second electrode terminal groups functions as an excitation electrode terminal.

The MEMS resonator of the present invention places at least one or more electrode terminals on each both sides of the oscillator. And width about the vibrating direction of the oscillator and the electrode terminal is made equal. Furthermore, the gap between the oscillator and the electrode terminal and the gap between adjoining electrode terminals are made equal.

As a result, in the process step of the dry etching for forming the oscillator, since the pattern density of the region put to etching gas becomes uniform substantially, a micro loading effect is inhibited. Thereby, the accuracy of dimension of the oscillator improves compared with conventionally. As a result, the MEMS resonator with little variation in resonance frequency can be obtained.

According to the fabricating method of the MEMS resonator according to the present invention, and the etching mask used by this fabricating method according to the present invention, variation in the etching rate by a micro loading effect can be made uniform as much as possible, and the resonator (beam) excellent in size control nature can be formed.

Furthermore, According to the MEMS resonator of the present invention, the variation in the resonance frequency between each MEMS resonators formed by the same fabricating process can be controlled to practically sufficient grade.

DESCRIPTION OF REFERENCE SYMBOLS

10: MEMS resonator,
12: Base substance,
12a: Principal surface,
14: Oscillator,
14a: Vibration portion,
14b, 14c: Fixed part,
14d, 16a, 50: Plug,
14e: Center line,
16: Electrode,
16R: First electrode terminal group,
16L: Second electrode terminal group,
$16R_1$-$16R_6$, $16L_1$-$16L_6$, 48: Electrode terminal,
18: Direct current power supply,
19: Alternating current power supply,
20: Bridge,
21: Outputting part,
22: Silicon substrate,
22a: First principal surface,
23: Wiring,
24: SiN film,
26: $SiO_2$ film,
26a, 30a: Surface,
28: Pore,
30: Polysilicon film,
32: Etching mask,
34: Radiator formation scheduled region,
36: Mask pattern for radiators,
38: Electrode formation scheduled region,
40: Mask pattern for electrodes,
42: Mask pattern for bridges,
44: Bridge formation scheduled region, and
46: Coupling capacitor.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Hereafter, this embodiment according to the present invention will be described with reference to drawings. In addition, each drawing is only what is shown roughly to such an extent that it can understand the present invention about shape, a size, and arrangement relationship of each component. Moreover, although a preferred configuration example of the present invention will be explained hereafter, construction material, a numerical condition, etc. of each component are only a mere good example. Therefore, the present invention is not limited to following embodiments at all. Furthermore, in each drawing, the same reference numeral may be given to a common component, and then the explanation may be omitted.

(Structure of MEMS Resonator)

An embodiment of structure of a MEMS resonator will be described with reference to FIGS. 1 and 2.

Figure 1:
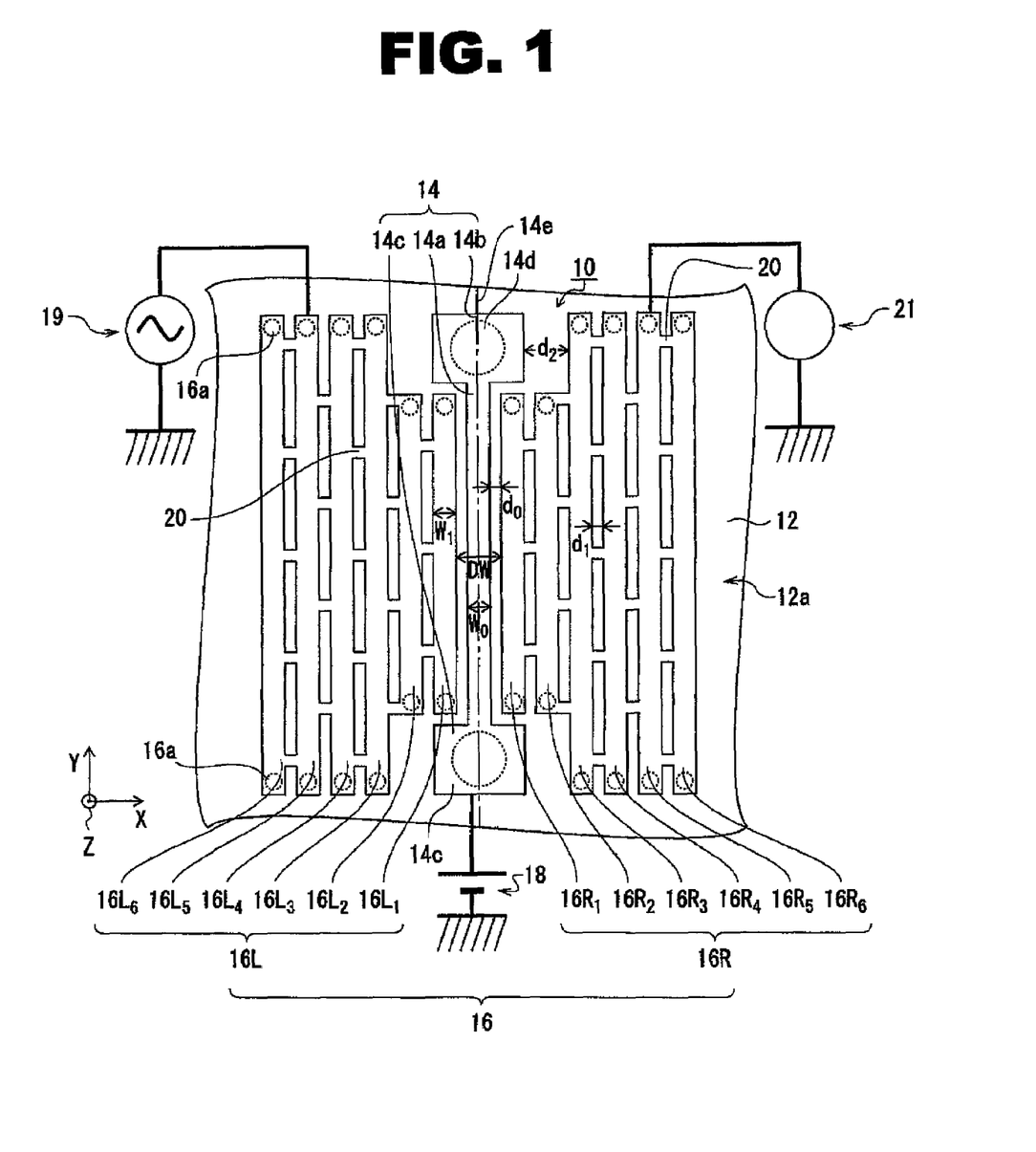
FIG. 1 is a top view of a MEMS resonator according to the present invention.

FIG. 1 is a top view showing a MEMS resonator. FIG. 2 is an important section amplification perspective view with which explanation of the MEMS resonator is presented.

Referring to FIG. 1, a MEMS resonator 10 includes an oscillator 14 and an electrode 16.

The oscillator 14 includes a vibration portion 14a and fixed parts 14b and 14c.

Both edges of the vibration portion 14a are being fixed to a base substance 12 by the fixed parts 14b and 14c, and the vibration portion 14a has composition which can be vibrated in a surface parallel to a principal surface 12a of the base substance 12. It is preferred for this vibration portion 14a to estrange from the principal surface 12a and to consider it as a long and slender rod-like structure or a plate structure which extends linearly in a surface parallel to the principal surface 12a.

The electrode 16 is provided in both sides of the vibration portion 14a in parallel for an extending direction of the vibration portion 14a, respectively, and includes a first electrode terminal group 16R ($16R_1$~$16R_6$) and a second electrode terminal group 16L ($16L_1$~$16L_6$) which are being fixed, respectively so that it may not vibrate, or so that it may not vibrate as much as possible, on the base substance 12.

If it explains more specifically, the first electrode terminal group 16R is placed mainly by the vibration portion 14a at one side (right-hand side of drawing) of the vibration portion 14a, and the second electrode terminal group 16L is placed at the other side (left-hand side of drawing).

The first and second electrode terminal groups 16R and 16L are symmetrically placed about the vibration portion 14a. The first electrode terminal group 16R includes two or more elongated electrode terminals $16R_1$-$16R_6$. It is preferred for these electrode terminals $16R_1$-$16R_6$ to be considered as a long and slender rod-like structure or plate structure. Furthermore, the second electrode terminal group 16L includes two or more elongated electrode terminals $16L_1$-$16L_6$. It is preferred for these electrode terminals $16L_1$-$16L_6$ to consider it as a long and slender rod-like structure or plate structure. Moreover, the number of the electrode terminal which composes the first and second electrode terminal groups 16R and 16L shall be the same number.

Although this embodiment shows six as the number of the electrode terminals included in the first and second electrode terminal groups 16R and 16L, this number can be arbitrarily set up according to a design.

Moreover, these electrode terminals $16R_1$-$16R_6$ and $16L_1$-$16L_6$ extend in parallel with the vibration portion 14a, respectively, and are provided.

Furthermore, in the first electrode terminal group 16R, each adjoining electrode terminal is mutually joined by an individual bridge, i.e., a bridge part 20. Similarly, in the second electrode terminal group 16L, each adjoining electrode terminal is mutually joined by an individual bridge, i.e., a bridge part 20.

In addition, these bridges 20 are effective to form with a conductive material, and more preferably to form with the same material as the electrode terminal.

Moreover, hereinafter, when the electrode terminals $16R_1$-$16R_6$ and $16L_1$-$16L_6$ do not need to be distinguished in particular, it is merely called "electrode 16".

Hereinafter, each component included in the MEMS resonator will be explained.

<Oscillator>

The oscillator 14 includes the vibration portion 14a, and the fixed parts 14b and 14c, as already explained. Although mentioned later for details, the oscillator 14 is formed simultaneously with the electrode 16 and the bridge 20 by performing dry etching of the film (preferably for example, a polysilicon film) formed at the principal surface 12a side of base substance 12. Here, it is effective preferably to use this polysilicon film as the film of one layer.

Preferably, the vibration portions 14a are a rod-like structure, especially a long picture square pole, for example, and are made by one with the fixed parts 14b and 14c provided in both ends. The vibration portion 14a is supported by the fixed parts 14b and 14c provided in both ends in the state where it floated from the principal surface 12a of base substance 12 (refer to FIG. 2). That is, a gap is provided between the vibration portion 14a and the principal surface 12a of base substance 12, and the vibration portion 14a is placed in parallel with the principal surface 12a.

The vibration portion 14a vibrates with predetermined resonance frequency in response to the excitation electric field impressed to the second electrode terminal group 16L in the direction (this direction is a direction shown by arrow DW of FIG. 1, and is called a "vibrating direction") which intersects perpendicularly with the extending direction of vibration portion 14a in a surface parallel to the principal surface 12a.

Here, system of coordinates used on this specification for facilities of explanation is defined. As shown in FIG. 1, a vibrating direction of vibration portion 14a is made into the direction of X. Moreover, an extending direction (direction right-angled in the direction of X in a surface parallel to principal surface 12a) of vibration portion 14a is made into the direction of Y. Furthermore, a direction perpendicular to principal surface 12a of base substance 12 (the direction of the rear surface of the drawing) is made into the direction of Z.

When a size of vibration portion 14a is expressed using these system of coordinates, X length of vibration portion 14a, i.e., width, is $W_0$. Moreover, Z length of vibration portion 14a, i.e., thickness, is T (FIG. 2). Moreover, Y length of vibration portion 14a, i.e., overall length, is L (FIG. 2). Width $W_0$, thickness T, and overall length L are set as arbitrary preferred values according to the resonance frequency f0 of vibration portion 14a.

As for the fixed parts 14b and 14c, the plane shape is a columnar body (preferably square pillar body) of rectangular shape, and the fixed parts 14b and 14c are connected to the both ends of vibration portion 14a, respectively. The fixed parts 14b and 14c are mutually isomorphous, and are formed about the direction of X more broadly than the vibration portion 14a. The fixed parts 14b and 14c are fixed to the base substance 12 by plugs 14d and 14d. In for more details, these plugs 14d and 14d are mechanically and electrically connected to a wiring 23 (FIG. 2) beforehand formed in a first principal surface 22a of a silicon substrate 22. The fixed parts 14b and 14c function as a fulcrum at the time of the vibration portion 14a performing mechanical oscillation to the vibrating direction (the direction of X). Moreover, a direct current power supply 18 for impressing bias voltage to the vibration portion 14a is connected to the fixed part 14c.

<Electrode>

The electrode terminal $16R_1$-$16R_6$ of the first electrode terminal group 16R and the electrode terminal $16L_1$-$16L_6$ of the second electrode terminal group 16L are placed at plane symmetry, i.e., mirror image relationship, about a flat surface including a center line 14e of the vibration portion 14a. Each electrode terminal $16R_1$-$16R_6$ and $16L_1$-$16L_6$ are effective to consider it as a rod-like structure (preferably for example, the lengthy square pole form same as the vibration portion 14a).

More specifically, in the region on the right-hand side of the drawing of the vibration portion 14a, the electrode terminal $16R_1$-$16R_6$ is placed in parallel for the vibration portion 14a in this order, toward the direction estranged from the vibration portion 14a. Each electrode terminal $16R_1$-$16R_6$ is fixed to a wiring (not shown) provided in the first principal surface 22a of the silicon substrate 22 by the plugs 16a, 16a . . . provided in the both ends of the direction of Y. And, it is connected to one electrically and mechanically on three or more bridges 20, respectively between the electrode terminal $16R_i$ and $16R_{i+1}$ (where i denotes integer of 1 to 5) which are mutually contiguous.

Similarly, in a region on the left-hand side of vibration portion 14a, the electrode terminal $16L_1$ to $16L_6$ is placed in parallel for vibration portion 14a in this order, toward a direction estranged from the vibration portion 14a. Each electrode terminal $16L_1$ to $16L_6$ is fixed to a wiring (not shown) provided in the first principal surface 22a of the silicon substrate 22 by the plugs 16a, 16a . . . provided in the both ends of the direction of Y. And, it is connected to one electrically and mechanically on three or more bridges 20, respectively between the electrode terminal $16L_i$ and $16L_{i+1}$ which are mutually contiguous.

Width $W_1$ in the vibrating direction DW of each electrode terminal $16R_1$-$16R_6$ and $16L_1$-$16L_6$ are the same as width $W_0$ of the vibration portion 14a.

Moreover, distance $d_1$ in the vibrating direction DW between the electrode terminals $16R_i$ and $16R_{i+1}$ which are mutually contiguous is the same as distance $d_0$ in the vibrating direction DW between the electrode terminal $16R_1$ which adjoin the vibration portion 14a and the vibration portion 14a, and also has a size which both sides 16R$_1$ and 14a do not contact at the time of the peak swing of vibration of the vibration portion 14a.

Similarly, distance d$_1$ in the vibrating direction DW between the electrode terminals 16L$_i$ and 16L$_{i+1}$ which are mutually contiguous is the same as distance d$_0$ in the vibrating direction DW between the electrode terminal 16L$_1$ which adjoin the vibration portion 14a and the vibration portion 14a, and also has a size which both sides 16L$_1$ and 14a do not contact at the time of the peak swing of vibration of the vibration portion 14a.

At least one electrode terminal among two or more electrode terminals 16R$_1$-16R$_6$ and 16L$_1$-16L$_6$, for example, the electrode terminal 16L$_1$, is an excitation electrode terminal for exciting the oscillator 14, in particular vibration portion 14a. The electrode terminal 16L$_1$ which functions as this excitation electrode terminal is placed adjoining the vibration portion 14a.

In this case, the second electrode terminal group 16L including excitation electrode terminal 16L$_1$ is an electrode group for exciting the oscillator 14. The second electrode terminal group 16L has integral construction electrically and mechanically, as mentioned above. Moreover, in order to impress a vibration electric field for the excitation electrode terminal 16L$_1$, suitable electrode terminal 16L$_i$ of the second electrode terminal group 16L is connected to an alternating current power supply 19.

The first electrode terminal group 16R has integral construction electrically and mechanically, and is connected to an outputting part 21 for extracting the mechanical oscillation of the vibration portion 14a as electric information, for example, vibrating current.

Here, "a peak swing of vibration" denotes distance between a maximum displacement point at the time of the vibration portion 14a vibrating with predetermined resonance frequency, and a stillness position at the time of aperiodicity of the vibration portion 14a.

Width W$_1$ about the direction of X of each electrode terminals 16R$_1$-16R$_6$ and 16L$_1$-16L$_6$ is formed equally to width W$_0$ of the vibration portion 14a, as already explained (W$_1$=W$_0$). Moreover, a gap of distance d$_0$ is provided between the electrode terminals 16R$_1$ and 16L$_1$, and the vibration portion 14a. In addition, distance d$_0$ is set as a greater value than a peak swing of vibration of the vibration portion 14a. As a result, contact with the vibration portion 14a and the electrode terminals 16R$_1$ and 16L$_1$ is prevented in the case of vibration of the vibration portion 14a.

Moreover, a gap of distance d$_1$ is provided between the electrode terminals 16R$_i$ and 16R$_{i+1}$ which are mutually contiguous, or between the electrode terminals 16L$_i$ and 16L$_{i+1}$ which are mutually contiguous, and this distance d$_1$ is set as a size equal to above-mentioned distance d$_0$ (d$_1$=d$_0$), as already explained.

The electrode terminals 16R$_1$, 16R$_2$, 16L$_1$ and 16L$_2$ approached and prepared for the vibration portion 14a among the electrode terminals 16R$_1$-16R$_6$ and 16L$_1$-16L$_6$, are substantially formed in length equal to the vibration portion 14a about the direction of Y. Moreover, the electrode terminals 16R$_3$-16R$_6$ and 16L$_3$-16L$_6$ except the electrode terminals 16R$_1$, 16R$_2$, 16L$_1$ and 16L$_2$ are substantially formed in length equal to the oscillator 14 about the direction of Y. That is, as compared with the electrode terminals 16R$_1$, 16R$_2$, 16L$_1$ and 16L$_2$, the electrode terminals 16R$_3$-16R$_6$ and 16L$_3$-16L$_6$ are formed for long, respectively.

As a result, between the electrode terminals 16R$_3$-16R$_6$ and 16L$_3$-16L$_6$ placed around the fixed parts 14b and 14c as both edges of the oscillator 14, and the fixed parts 14b and 14c, a gap more than or equal to distance d$_0$ between the electrode terminals 16R$_1$ and 16L$_1$ and the vibration portion 14a are provided, about the direction of X. If explaining using the example of FIG. 1, between the electrode terminals 16R$_3$ and 16L$_3$ which adjoins the fixed parts 14b and 14c about the direction of X, and the fixed parts 14b and 14c, a gap of distance d$_2$ (=W$_1$+2d$_1$) is provided.

As for this distance d$_2$, it is preferred to determine in consideration of electrostatic capacity "Cx" between the vibration portion 14a and the electrode 16, and electrostatic capacity "Cy" between the fixed parts 14b and 14c and the electrode 16. In for more details, "Cx" and "Cy" are approximately given by following equation (2) and following equation (3), respectively.

$$Cx \approx \epsilon(L \times T/d_0) \quad (2)$$

$$Cy \approx \epsilon(L' \times T/d_2) \quad (3)$$

where "$\epsilon$" denotes a dielectric constant of atmosphere (for example, inside of a vacuum or the atmosphere, etc.) which the MEMS resonator 10 drives.

Moreover, "L" denotes overall length in the fixed part 14b individual direction of "Y". That is, when the fixed parts 14b and 14c have concerted plane shape, "L+2L'" gives overall length in the direction of "Y" of the oscillator 14 whole.

At this time, "d$_2$" is effective Cx>Cy, and more preferably is effective Cx>10Cy. That is, it is preferred to set up "d$_2$" so that following equation (4) or following equation (5) may be realized from the equation (2) and equation (3).

$$Cx>Cy: d_2>(L'/L)d_0 \quad (4)$$

$$Cx>10Cy: d_2>10(L'/L)d_0 \quad (5)$$

<Bridge>

The bridges 20, 20 . . . is the parts for connecting electrically and mechanically the adjoined electrode terminal 16R$_i$ and 16R$_{i+1}$, or 16L$_i$ and 16L$_{Li+1}$. The bridges 20, 20 . . . are formed in one with the electrode 16. The bridges 20, 20 . . . are formed from a polysilicon film which is common in the oscillator 14 and the electrode 16.

In for more details, in a configuration example of the MEMS resonator 10 shown in FIG. 1, three or more pieces of the bridges 20, 20 . . . are preferably placed between every adjoining electrode terminals of a pair. The gap between the adjoining bridges 20 and 20 about the direction of Y is equal about all the bridges 20. In addition, the number which provides this bridge 20 between the electrode terminals of a pair should just be taken as a number which can make variation in an etching rate uniform as much as possible, and can control vibration of an electrode terminal synchronizing with the vibration portion 14a.

The bridges 20, 20 . . . have a function for making uniform or substantially uniform an excitation electric field in excitation electrode terminal 16L$_1$ by connecting electrically between the electrode terminals 16L$_1$-16L$_6$ to netted form. Moreover, the bridges 20, 20 . . . have a function for controlling vibration of the first electrode terminal group 16R and the second electrode terminal group 16L synchronized with vibration of the vibration portion 14a as much as possible, by connecting mechanically between the electrode terminals 16R$_1$-16R$_6$ and 16L$_1$-16L$_6$ to netted form.

<Size>

Next, concrete values, such as a size of the MEMS resonator 10, will be explained. In addition, sizes described in the following are one preferred example to the end. Therefore, the size of the MEMS resonator is not limited to the following concrete value, but can be set to it arbitrarily suitably according to a design.

When the resonance frequency of the MEMS resonator 10 shall be about 280 kHz, overall length L of the vibration portion 14a may be about 270 μm (micro meters) preferably, for example. Width $W_0$ of the vibration portion 14a may be about 3 μm (micro meters) preferably, for example. Moreover, thickness T of the vibration portion 14a may be about 2 μm (micro meters) preferably, for example Moreover, electrode terminal adjoining the vibration portion 14a and the vibration portion 14a, i.e., distance $d_0$ between the excitation electrode terminals $16R_1$ and $16L_1$ may be about 150 nm preferably, for example. Moreover, distance $d_2$ about the direction of X between the fixed parts 14b and 14c, and the electrode terminal $16R_3$ and $16L_3$ may be about 3.3 μm (micro meters) preferably, for example. Moreover, bias voltage impressed to the fixed part 14c may be set to 2V.

(Fabricating of MEMS Resonator)

Figure 3A:
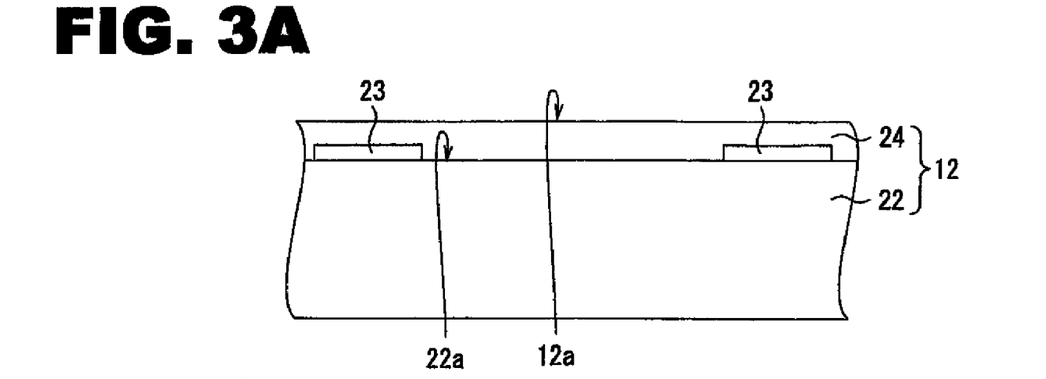
FIGS. 3A to 3C are sectional views showing a fabricating process of the MEMS resonator in this order.
Figure 3B:
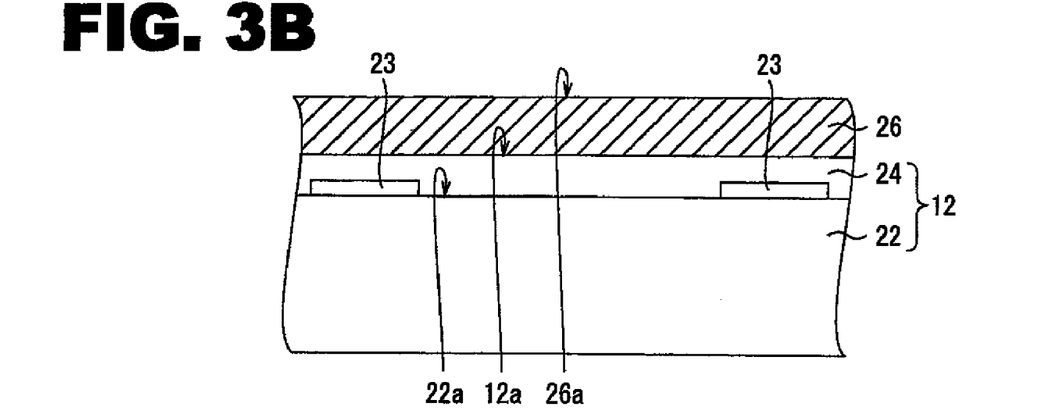
Figure 3C:
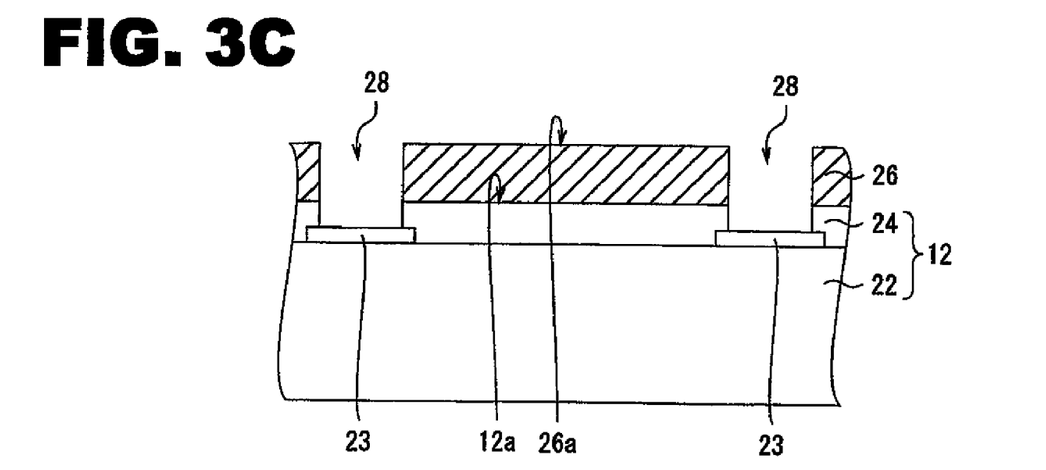
Figure 4A:
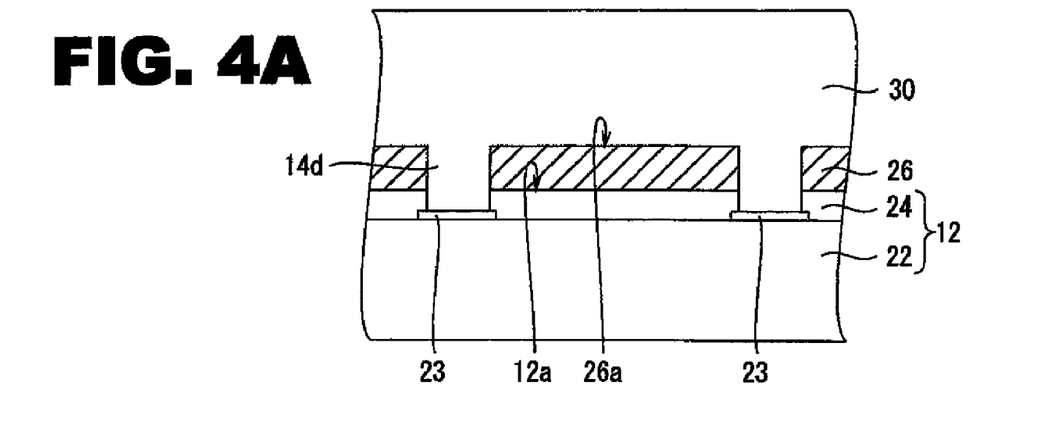
FIGS. 4A to 4C are sectional views showing a fabricating process of the MEMS resonator which follows FIG. 3C in this order.
Figure 4B:
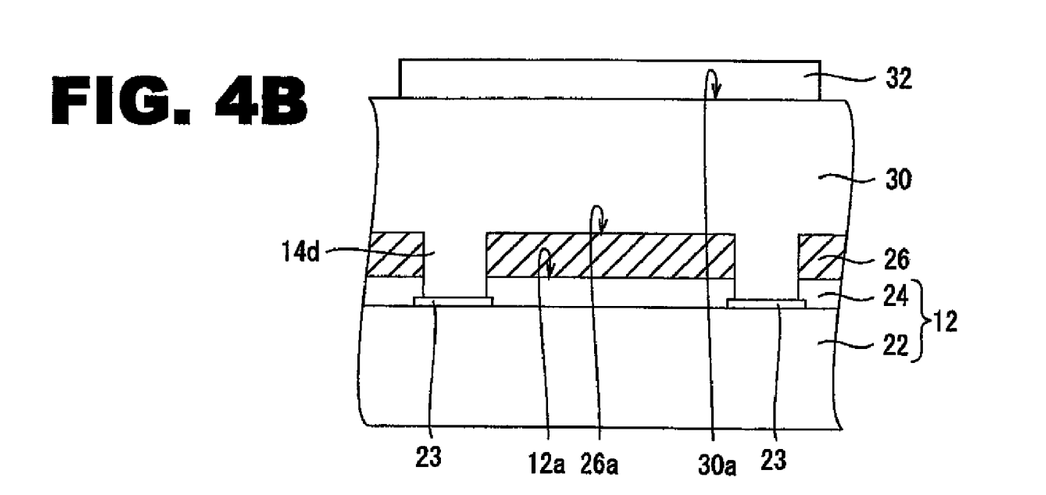
Figure 4C:
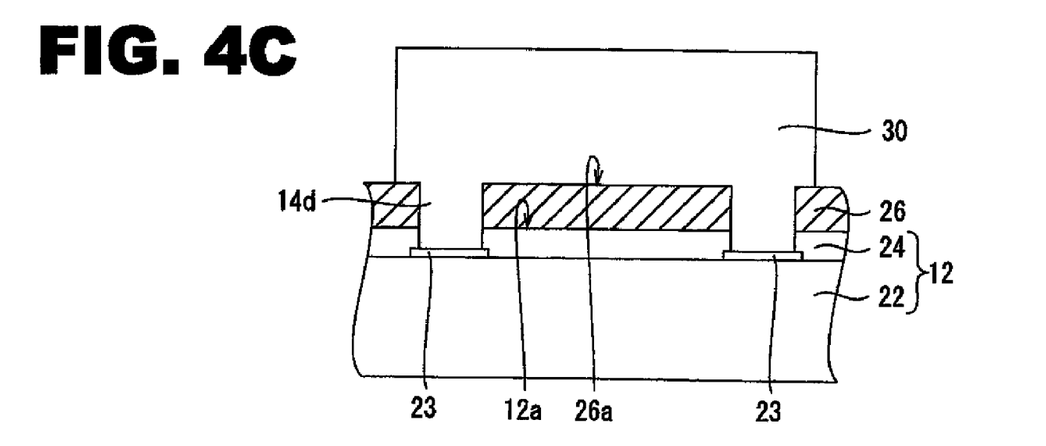
Figure 5:
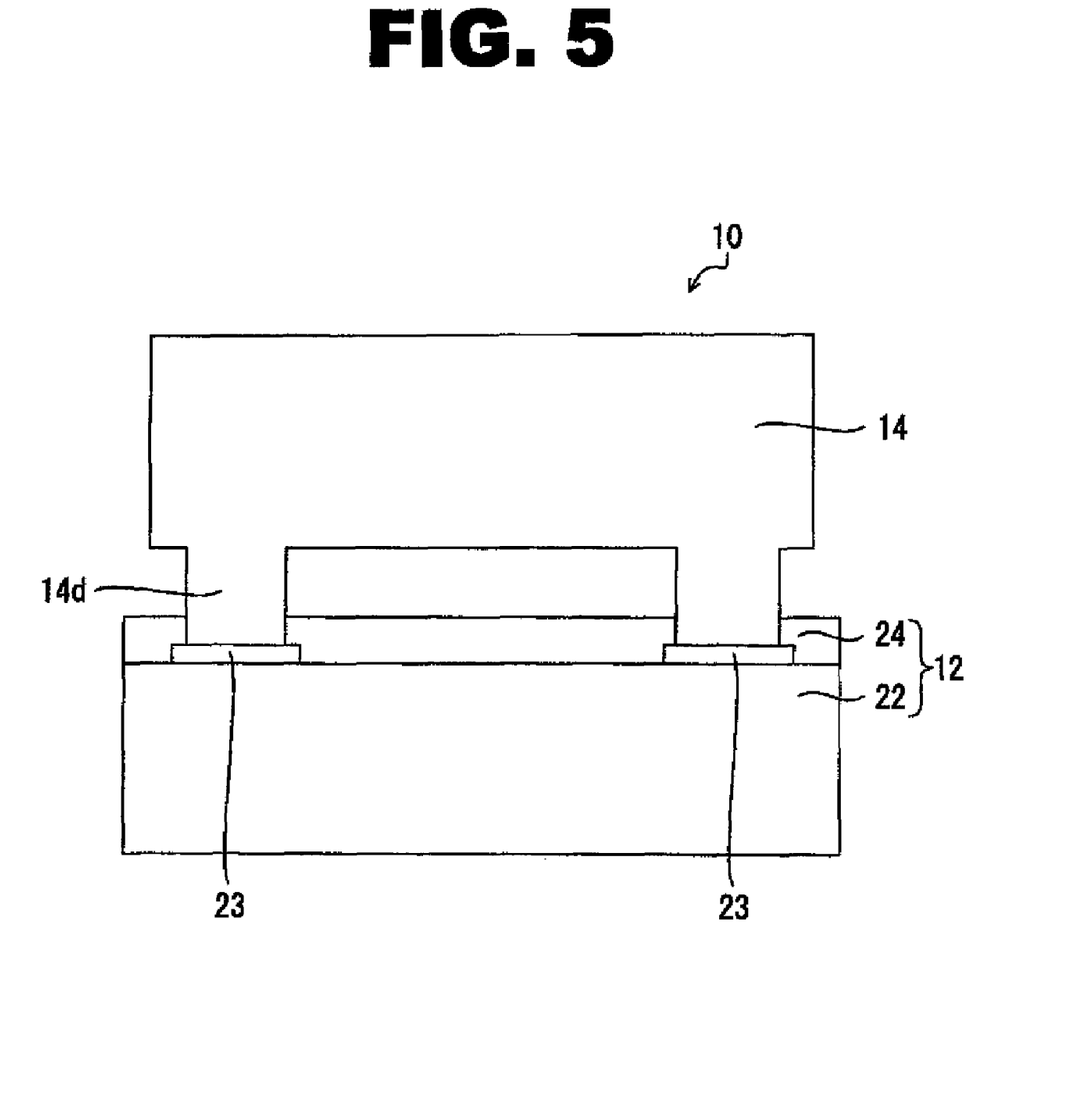
FIG. 5 is a sectional view showing a fabricating process of the MEMS resonator which follows FIG. 4C.
Figure 6:
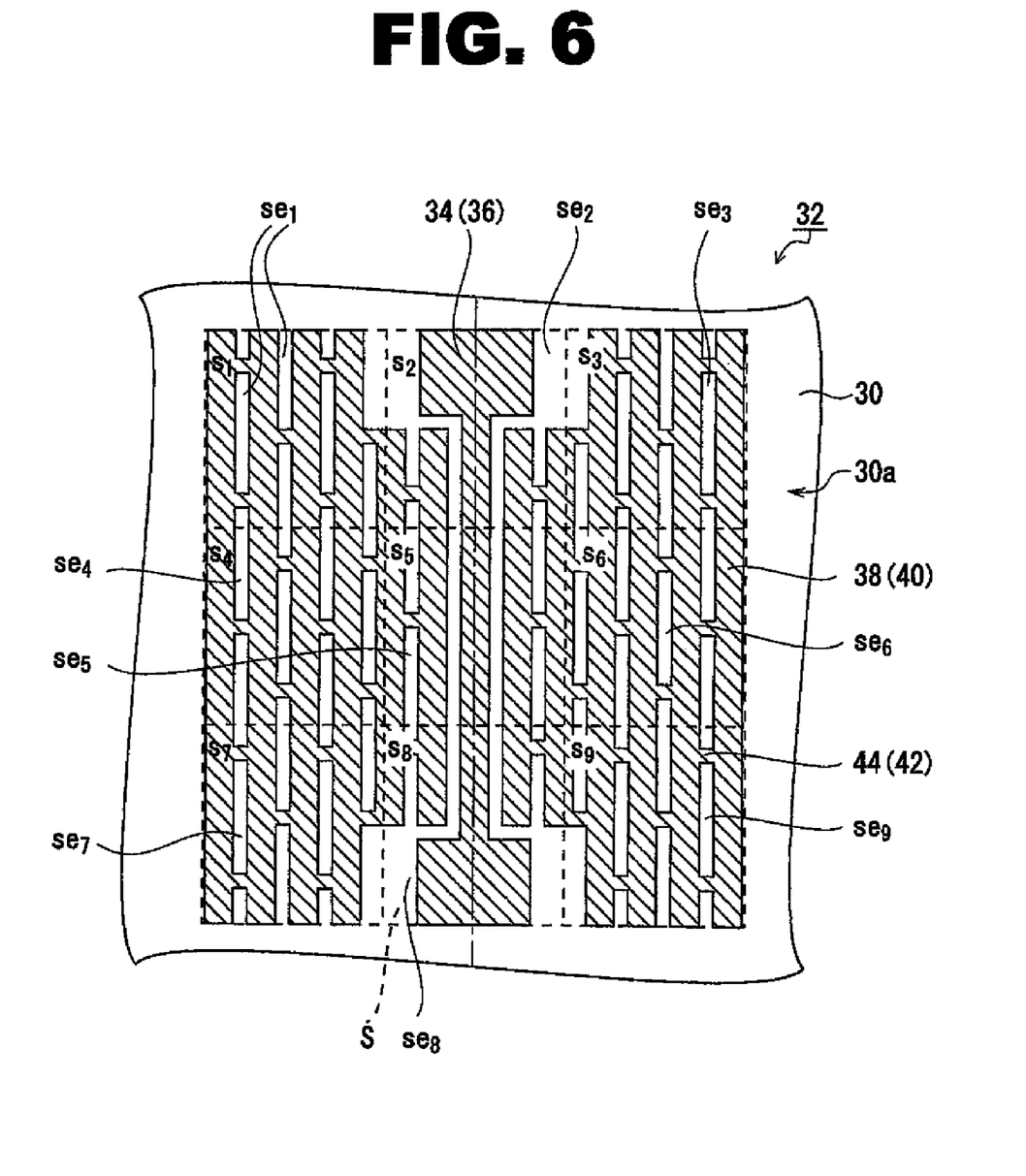
FIG. 6 is a top view of an etching mask according to the present invention.

Next, a method for fabricating the MEMS resonator 10 and an etching mask used for fabricating of the MEMS resonator will be explained with reference to FIGS. 3 to 6. FIGS. 3 to 5 are fabricating process charts of the MEMS resonator, and each drawing is a drawing showing the cross section cut along the center line 14e of FIG. 1 in a fabricating process stage. FIG. 6 is a top view showing an etching mask.

<Process Step 1>

First of all, a base substance 12 as shown in FIG. 3A is formed. In for more details, a silicon substrate 22 is prepared. And then, a wiring 23, preferably made from Al, is patterned and formed in a first principal surface 22a of the silicon substrate 22 by a well-known method.

Next, all over the first principal surface 22a of this silicon substrate 22, SiN film 24, which has a thickness of about 100 nm preferably, for example, is formed so that the wiring 23 may be covered by using LPCVD Wow Pressure Chemical Vapor Deposition). Thereby, the base substance 12 which consists of the substrate 22, the wiring 23, and the SiN film 24 is completed.

<Process Step 2>

Next, a structure as shown in FIG. 3(B) is formed. In for more details, $SiO_2$ film 26, for example, about 200 nm thick is preferably formed by LPCVD on the principal surface 12a of the base substance 12, i.e., the surface 12a of the SiN film 24.

In addition, so to speak, the $SiO_2$ film 26 is a sacrificial film, and will be removed in (process step 7) mentioned later.

<Process Step 3>

Next, a structure as shown in FIG. 3(C) is formed. In for more details, a photoresist is applied by a thickness of about 1 μm (micro meters) with a spin coat method, for example, all over the surface 26a of the $SiO_2$ film 26. After that, a photoresist pattern (not shown) which has an aperture which the surface 26a of the $SiO_2$ film 26 exposes is formed in region to be used for the plugs 14d and 14d (FIG. 1) of the oscillator 14 by a well-known photolithography.

Although not illustrated, the aperture which the surface 26a exposes also to region to be used for the plugs 16a, 16a ... (FIG. 1) of the electrode 16 is formed in this photoresist pattern.

Then, by using this photoresist pattern as a mask, dry etching is performed by RIE (Reactive Ion Etching), and then the $SiO_2$ film 26 and the SiN film 24 of a region exposed from an aperture are removed. As a result, in the region exposed from this aperture, the $SiO_2$ film 26 and the SiN film 24 are penetrated, and a pore 28 which the wiring 23 formed in the first principal surface 22a exposed is formed.

In addition, in this dry etching, in order to prevent the over etching of the wiring 23, it is preferred to adjust composition of etching gas and to enlarge etch selectivity of the SiN film 24 and the $SiO_2$ film 26 for Al which is a wiring material. More specifically, by using a parallel plate type RIE system, the mixed gas of $C_4F_8$ (about 20 sccm), $O_2$ (about 10 sccm), and Ar (about 400 sccm(s)) is used as etching gas, it is preferred to set chamber internal pressure to about 20 mTorr, and for plasma power to be about 1500 W, and to perform dry etching.

Then, the photoresist pattern is removed by $O_2$ ashing, ozone ashing, etc. Thereby, as shown in FIG. 3(C), the structure provided with the sacrificial film ($SiO_2$ film 26) which covers the region of the principal surface 12a excluding the both edges (fixed parts 14b and 14c) of the oscillator 14 is obtained.

<Process Step 4>

Next, a structure as shown in FIG. 4(A) is formed. For more details, all over the $SiO_2$ film 26 having included the pore 28, a polysilicon film 30 is preferably formed as a conductive film, for example by a thickness of about 2 μm (micro meters) preferably by LPCVD.

By through this process step, the plugs 14d and 14d which fix the oscillator 14 to the base substance 12 and the plugs 16a, 16a ... (not shown) which fix the electrode 16 to the base substance 12, are formed in the aperture formed at process step 3.

In addition, since this polysilicon film 30 is a film which should constitute the oscillator 14, the electrode 16, and the bridge 20 where current is impressed, it needs to suppress electric resistance as much as possible. Therefore, in membrane formation of the polysilicon film 30, it is preferred to mix and use $SiH_4$ (about 1000 sccm) and $PH_3$ (a phosphine, about 130 sccm) which are material gas by using a LPCVD apparatus, and to perform on conditions with a chamber pressure force of about 0.7 mTorr and a forming temperature of about 560° C. Thereby, P concentration in the obtained polysilicon film 30 can be made into more $5\times1020/cm^3$ value. By doing in this way, the electric resistance of the polysilicon film can be reduced below to about 2 mΩ·cm. In addition, a film which consists of material of other low resistance may be used instead of a polysilicon film.

<Process Step 5>

Next, a structure as shown in FIG. 4(B) is formed. For more details, all over surface 30a of polysilicon film 30, photoresist is applied by a thickness of about 1 μm (micro meters) by using a spin coat method, for example. After that, an etching mask 32 of the present invention is formed by a well-known photolithography.

Here, with reference to FIG. 6, the etching mask 32 of the present invention is explained in detail.

If FIG. 6 is referred to, the etching mask 32 is provided with a mask pattern 36 for oscillators, a mask pattern 40 for electrodes, and a mask pattern 42 for bridges.

The mask pattern 36 for oscillators is provided by covering an oscillator formation scheduled region 34 on a conductive film (polysilicon film) 30 formed upside of all over the base substance 12. Moreover, the mask pattern 40 for electrodes is provided by covering an electrode formation scheduled region 38 of this conductive film 30.

And as natural, widths $W_0$ and $W_1$ about vibrating direction DW of the mask pattern 36 for oscillators and the mask pattern 40 for electrodes is made the same, and gap $d_0$ between mask patterns 40 for electrodes contiguous to this mask pattern 36 for oscillators and gap $d_1$ between adjoining mask patterns 40 for electrodes are made the same.

Furthermore, between the adjoining mask patterns 40 and 40 for electrodes, the mask patterns 42, 42 . . . for bridges are provided so that these mask patterns 40 and 40 for electrodes may be connected.

Next, the pattern density about the etching mask 32 will be explained.

Here, region S which includes the whole by the outer contour line of the etching mask 32 is set up, and this region S is equally divided further to congruent partitions $s_1$-$s_9$ mutually with rectangular shape area smaller than region S. As what size a partition is set should just set up appropriately in consideration of the size of each mask pattern. Each area of these partitions $s_1$-$s_9$ is set to As. In addition, each partition s shall be area including at least two or more one side or the both sides of the mask pattern 36 for oscillators and the mask pattern 40 for electrodes.

In addition, the etched regions $se_1$-$se_9$ are made into the region which is not covered with the etching mask 32 in partition $s_1$-$s_9$, i.e., the region which the surface 30a of the polysilicon film 30 has exposed (region which does not attach hatching in FIG. 6). And the sum total of the length of an outer circumference in each of etching regions $se_1$-$se_9$ is set to $Lse_1$-$Lse_9$.

At this time, pattern densities $D_1$-$D_9$ for every partitions $s_1$-$s_9$ are given by the following equation (6).

$$D_{1-9} = Lse_{1-9}/As \quad (6)$$

As mentioned above, the width ($W_0$ or $W_1$) about the direction of X is equal to the mask pattern 36 for oscillators and the mask pattern 40 for electrodes, and the mask pattern 36 for oscillators and the mask pattern 40 for electrodes of each other are placed in parallel at equal intervals ($d_0$ or $d_1$) about the direction of X. Therefore, except for the partitions $s_2$ and $s_8$ corresponding to the fixed parts 14b and 14c, the pattern densities $D_1$-$D_9$ become equal mutually.

<Process Step 6>

Next, a structure as shown in FIG. 4(C) is formed. For more details, dry etching is performed by RIE by using the mask pattern 36 for oscillators, the mask pattern 40 for electrodes, and the mask pattern 42 for bridges as a mask, and the polysilicon film 30 of the etched regions $se_1$-$se_9$ (FIG. 6) is removed. As a result, in the etched regions $se_1$ to $se_9$, the polysilicon film 30 is removed and the surface 26a of the $SiO_2$ film 26 is exposed.

By passing through this dry etching process, the prototype of the oscillator 14, the electrode 16, and the bridges 20, 20 . . . is completed on the base substance 12. This prototype is passing through the below-mentioned (Process Step 7), and then changes to the finished product of the oscillator 14, the electrode 16, and the bridges 20, 20 . . . .

In addition, in this dry etching, in order to prevent over etching, it is preferred to adjust composition of etching gas and to enlarge etch selectivity of the polysilicon film 30 for the $SiO_2$ film 26. More specifically, it is preferred to set pressure in a chamber to about 5 mTorr and plasma power to about 500 W and to perform dry etching, by a parallel plate type RIE system by using $Cl_2$ (about 30 sccm) as etching gas.

Then, the etching mask 32 is removed by $O_2$ ashing, ozone ashing, etc. Thereby, the structure as shown in FIG. 4(C) is obtained.

<Process Step 7>

Next, as shown in FIG. 5, the MEMS resonator 10 is completed. For more details, the structure obtained at (process step 6) is dipped in an etching solution having included HF (fluoric acid). Thereby, the $SiO_2$ film 26 as a sacrificial film is dissolved and removed. As a result, the oscillator 14, the electrode 16, and the bridges 20, 20 . . . , provided with the vibration portion 14a in the state where it floated from the principal surface 12a of the base substance 12, and the fixed parts 14b and 14c provided in the both edges of the vibration portion 14a and connected on the surface of the base substance, are formed.

Thereby, the MEMS resonator 10 as shown in FIG. 1 is obtained.

EFFECT OF THE INVENTION

Next, the effect of the present invention will be explained.

<Advantage 1>

According to the method for fabricating the MEMS resonator of the present invention, in (process step 5), pattern densities $D_1$-$D_9$ are substantially made equal in the inside of region S which includes the whole etching mask 32 (FIG. 6). That is, according to the fabricating method of the present invention, the variation in the pattern density in the inside of the region to be used for the MEMS resonator 10 can be suppressed as much as possible.

As a result, in the dry etching process of (process step 6), a micro loading effect can be uniformly generated in the inside of the region to be used for the MEMS resonator 10. That is, the etching rate, in the inside of the region to be used for the MEMS resonator 10, for every etching regions $se_1$-$se_9$ can be made equal or can be substantially made equal. Therefore, the size control nature of the vibration portion 14a can be improved, and the variation in the resonance frequency of the obtained MEMS resonator 10 can be suppressed as much as possible.

<Advantage 2>

In the inside of the region to be used for the MEMS resonator 10, the etching mask of the present invention is formed so that pattern density may become uniform or substantially uniform regardless of a place. As a result, the variation in the resonance frequency of the obtained MEMS resonator 10 can be suppressed as much as possible for the same reason with <Effect 1> having explained.

<Advantage 3>

The MEMS resonator of the present invention is fabricated by using the fabricating method of the present invention. As a result, the variation in resonance frequency can be suppressed as much as possible for the same reason with <Advantage 1> having explained.

Moreover, The MEMS resonator of the present invention is fabricated by using the etching mask of the present invention. As a result, the variation in the resonance frequency of the MEMS resonator 10 can be suppressed as much as possible for the same reason with <Advantage 1> having explained.

<Advantage 4>

In the MEMS resonator of the present invention, the gap of distance $d_2$ is provided between the electrode terminals $16R_3$ and $16L_3$ which adjoin the fixed parts 14b and 14c of the oscillator 14, and the fixed parts 14b and 14c. Furthermore, this distance $d_2$ is set up so that Cx>Cy may be realized, and is set up so that Cx>10Cy may be realized more preferably.

As a result, the parasitic capacitance occurred between the fixed parts 14b and 14c and the electrode terminals $16R_3$ and $16L_3$ can be reduced to practically sufficient grade. Therefore, the level of signals (noise) except resonance frequency can be reduced compared with conventionally, and the effective signal of an S/N ratio can be extracted from the outputting part 21.

Modified Embodiment, Design Condition, etc.

Modified Embodiment 1

This embodiment explained the case where outputting part 21 for extracting an output is connected to the first electrode terminal group 16R, as shown in FIG. 1. However, the outputting part 21 does not necessarily need to provide in the first electrode terminal group 16R.

Figure 7:
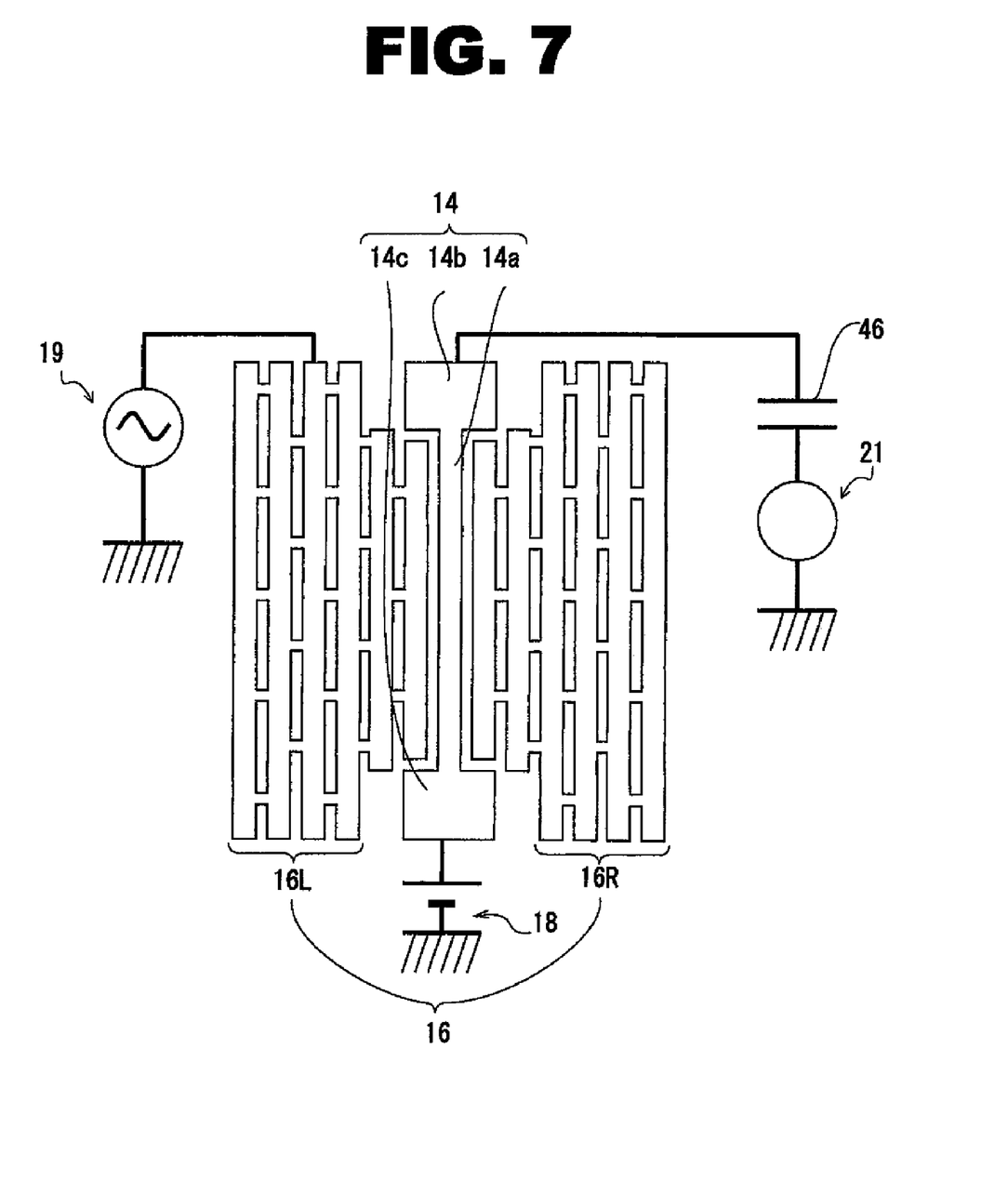
FIG. 7 is a mimetic diagram with which explanation of a modification of the MEMS resonator according to the present invention is presented.

For example, as shown in FIG. 7, the outputting part 21 may be connected to the fixed part 14b of the opposite side of the fixed part 14c to which the direct current power supply 18 is connected. In this case, it is preferred to provide a coupling capacitor 46 for removing a dc component from output signal between the outputting part 21 and the fixed part 14b.

In addition, in this case, so to speak, the first electrode terminal group 16R functions as dummy cathode, and does not play a positive role about the input/output of a signal.

Modified Embodiment 2

Figure 2:
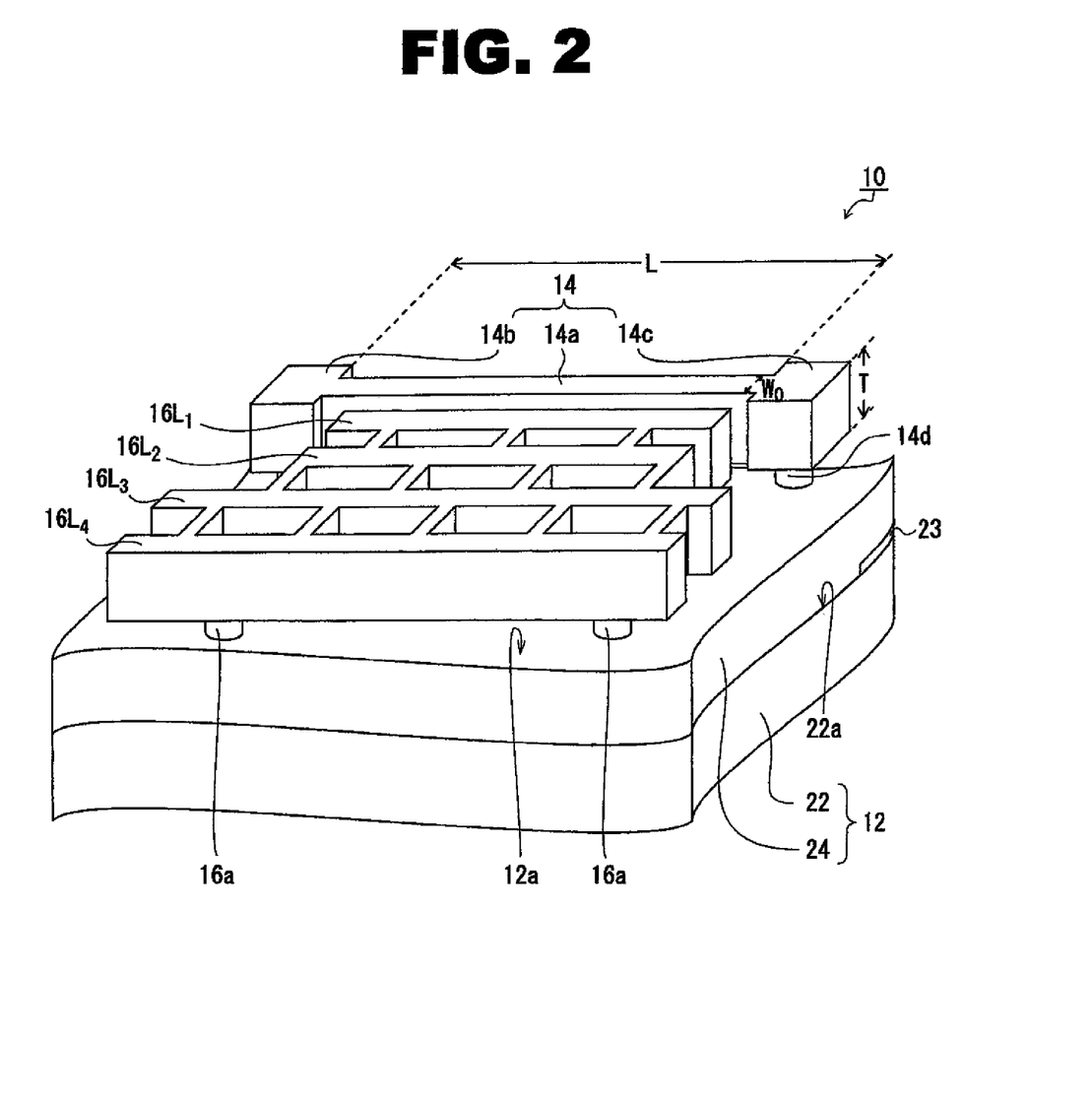
FIG. 2 is an important section amplification perspective view of the MEMS resonator according to the present invention.

As shown in FIGS. 1 and 2, at this embodiment, the electrode terminal $16R_1$-$16R_6$ and $16L_1$-$16L_6$ are fixed to base substance 12 only by the plugs 16a, 16a . . . which are provided in both ends, and each inter-electrode is connected by the bridges 20, 20 . . . .

This is for the electrode terminals $16R_1$-$16R_6$ and $16L_1$-$16L_6$ (in particular the electrode terminals $16L_1$ and $16R_1$) to prevent vibrating synchronizing with the oscillator 14. Therefore, if vibration interlocked with the oscillator 14 of the electrode terminals $16R_1$-$16R_6$ and $16L_1$-$16L_6$ can be prevented, the fixing method of an electrode terminal is not limited to the aspect of FIGS. 1 and 2.

Figure 8:
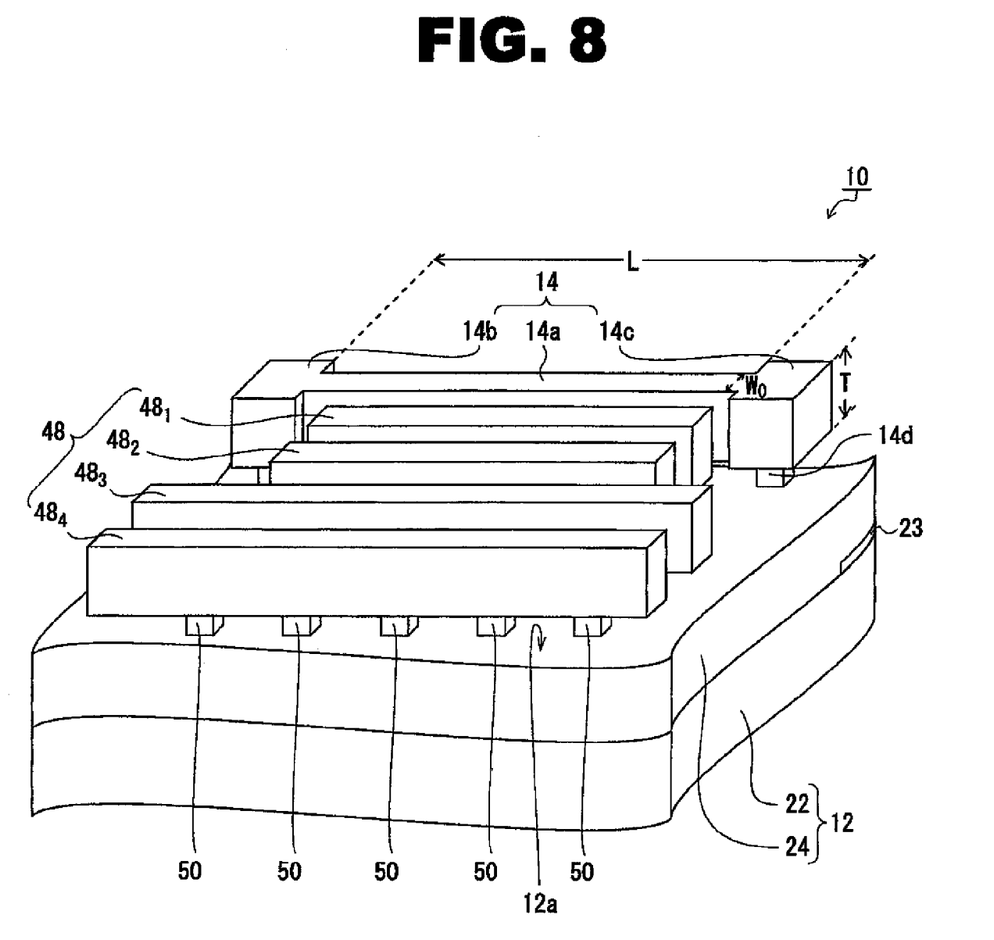
FIG. 8 is a mimetic diagram with which explanation of a modification of the MEMS resonator according to the present invention is presented.

For example, as shown in FIG. 8, plenty of plugs 50, 50 . . . connected to the base substance 12 may be provided in the electrode terminal 48, without using the bridges 20, 20 . . . . Also by composing in this way, vibration which synchronized with the oscillator 14 of the electrode terminal 48 ($48_1$-$48_4$) can be prevented.

In addition, in this case, the excitation electric field supplied from alternating current power supply 19 is impressed to electrode 48 through the wiring provided in the inside of the base substance, and the plugs 50, 50, . . . .

Modified Embodiment 3

In this embodiment, the length of the electrode terminals $16R_3$-$16R_6$ and $16L_3$-$16L_6$ is explained the case where the length is equal to the overall length along in the direction of Y of the oscillator 14.

However, the length of the electrode terminals $16R_3$-$16R_6$ and $16L_3$-$16L_6$ is not limited to this length, if a micro loading effect can be made uniform or substantially uniform in the practically permissible range.

Figure 9:
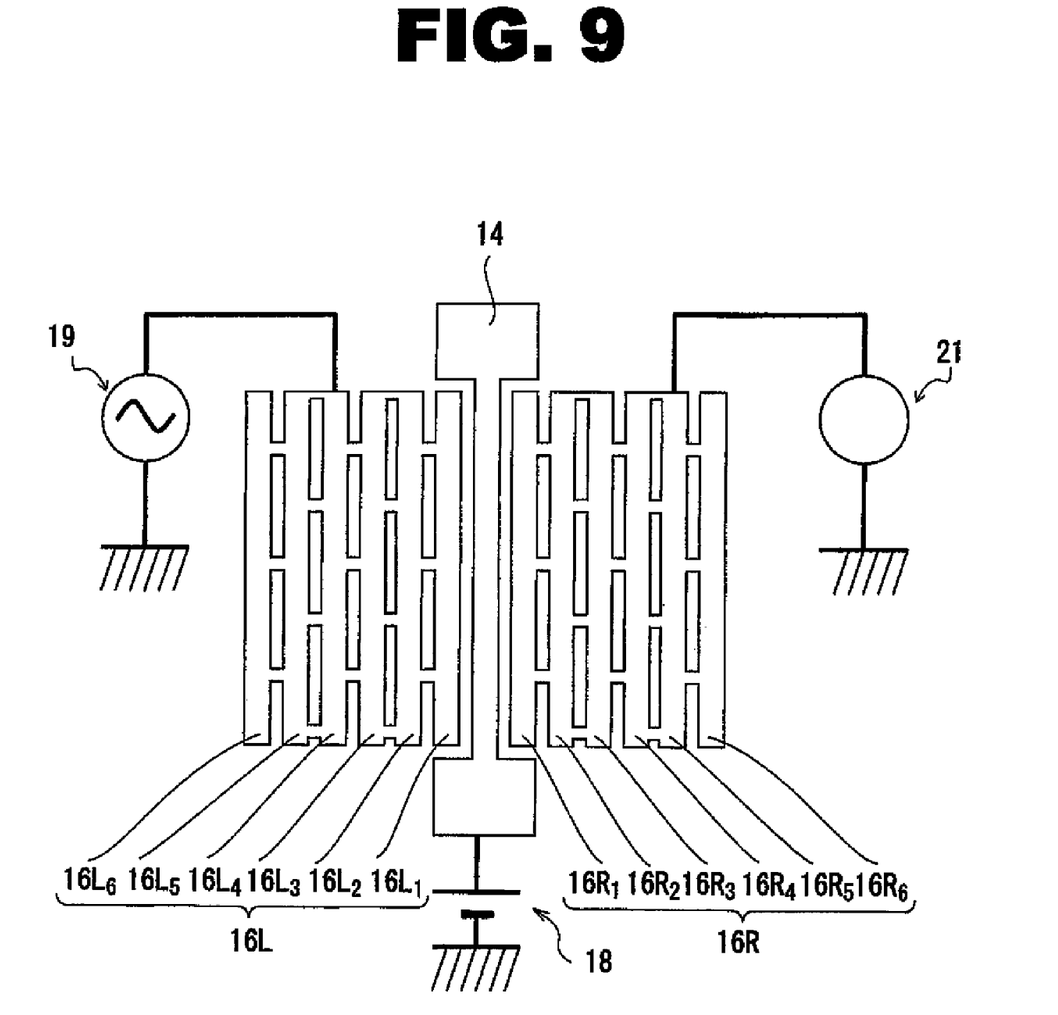
FIG. 9 is a mimetic diagram with which explanation of a modification of the MEMS resonator according to the present invention is presented.

For example, as shown in FIG. 9, it is effective also considering the length of the electrode terminals $16R_3$-$16R_6$ and $16L_3$-$16L_6$ is equal to the length of the electrode terminals $16R_1$, $16R_2$, $16L_1$, and $16L_2$.

When it does in this way, the parasitic capacitance occurred between the fixed parts 14b and 14c and the electrode can be further reduced. Therefore, the level of signals (noise) except resonance frequency can be reduced compared with conventionally, and the effective signal of S/N can be extracted from the outputting part 21.

<Design Condition 1>

This embodiment explained the case where the first and second electrode terminal groups 16R and 16L are composed with six electrode terminals $16R_1$-$16R_6$, and $16L_1$-$16L_6$, respectively. However, the number of the electrode terminal which composes the first and second electrode terminal groups 16R and 16L is not limited to six each if the variation in the etching rate by a micro loading effect can be suppressed as much as possible. It can be considered as the arbitrary preferred number according to a design.

According to the inventors' evaluation, it is preferred for the number of the electrode terminal which composes the first and second electrode terminal groups 16R and 16L is five or more, respectively, and it is preferred for it that it is ten or more preferably.

<Design Condition 2>

In this embodiment, the case where the vibration portion 14b it vibrates in a surface parallel to the principal surface 12a of the base substance 12 is explained. However, the present invention is applicable also to the MEMS resonator of the form that a vibration portion vibrates in a surface vertical to the principal surface 12a of the substrate 12.

<Design Condition 3>

This embodiment explained so-called doubly-supported-beam-type MEMS resonator 10 with which the both edges of the vibration portion 14b are supported by the fixed parts 14b and 14c. However, a MEMS resonator may be the so-called cantilever type. The present invention is applicable also for a cantilever-type MEMS resonator.

What is claimed is:

1. A method for fabricating a MEMS resonator, which includes an oscillator and an electrode, wherein the oscillator includes a vibration portion which vibrates in a vibrating direction on a principal surface of a base substance and a fixed portion connected to the end of the vibration portion and fixed to the base substance, and the electrode is provided on both sides of the oscillator, comprising:

(f) forming a sacrificial film for covering said principal surface excluding a region to be used for said fixed part;

(g) forming a conductive film all over said principal surface upside so as to cover said sacrificial film;

(h) forming a mask pattern for oscillators which covers a region to be used for an oscillator, on said conductive film, and forming a mask pattern for electrodes which covers a region to be used for an electrode, on said conductive film, so that those patterns are apart from each other;

(i) performing dry etching for said conductive film, using said mask pattern for oscillators and said mask pattern for electrodes as an etching mask, and forming said oscillator and said electrode; and (j) removing said sacrificial film, wherein said mask pattern for oscillators includes a mask pattern part for a vibration portion extended linearly with a uniform width, and a mask pattern part for a fixed part joined with the end of the mask pattern part for a vibration portion, said mask pattern for electrodes includes a mask pattern part for first electrode terminal groups and a mask pattern part for second electrode terminal groups which are provided in mirror image relationship on both sides of said mask pattern for oscillators, each of said mask pattern part for the first electrode terminal groups and said mask pattern part for the second electrode terminal groups includes two or more elongated mask pattern parts used for the electrode terminal, each of the elongated mask patterns extending linearly with a uniform width and with a space between adjacent patterns, the width of said mask pattern part for vibration portions and the width of the said elongated mask pattern part are substantially the same as each other, and a gap or space between said mask pattern part for vibration portion and said elongated mask pattern part located adjacent the mask pattern part for vibration portion is determined to be the same as a gap or space between adjacent elongated mask pattern parts.

2. The method for fabricating the MEMS resonator according to claim 1, wherein said mask pattern for electrodes further includes a plurality of bridging mask patterns, each of which couples every two adjacent elongated mask pattern parts in an orthogonal direction to the elongated mask pattern parts at constant intervals.

* * * * *